United States Patent [19]

Nachnani et al.

[11] Patent Number: 5,325,268
[45] Date of Patent: Jun. 28, 1994

[54] INTERCONNECTOR FOR A MULTI-CHIP MODULE OR PACKAGE

[75] Inventors: Manoj F. Nachnani, Cupertino; Hem P. Takiar, Fremont, both of Calif.

[73] Assignee: National Semiconductor Corporation, Santa Clara, Calif.

[21] Appl. No.: 10,964
[22] Filed: Jan. 28, 1993
[51] Int. Cl.$^5$ .............................................. H05K 7/10
[52] U.S. Cl. ..................... 361/767; 361/723; 361/748; 361/760; 361/807; 174/52.1; 174/255; 257/666; 257/690
[58] Field of Search .............. 361/718, 723, 728, 736, 361/748, 760, 761, 763, 764, 778, 807, 813; 174/52.1, 255, 257, 261; 257/666, 692, 690, 776, 786

[56] References Cited

U.S. PATENT DOCUMENTS

| | | |
|---|---|---|
| 3,676,748 | 7/1972 | Kobayashi et al. . |
| 3,872,583 | 3/1975 | Beall et al. . |
| 3,890,636 | 6/1975 | Harada et al. . |
| 3,955,269 | 5/1976 | Magdo et al. . |
| 4,079,511 | 3/1978 | Grabbe . |
| 4,115,837 | 9/1978 | Beall et al. . |
| 4,132,856 | 1/1979 | Hutchinson et al. . |
| 4,296,456 | 10/1981 | Reid . |
| 4,320,438 | 3/1982 | Ibrahim et al. . |
| 4,340,902 | 7/1982 | Honda . |
| 4,396,971 | 8/1983 | Beall et al. . |
| 4,475,007 | 10/1984 | Ohno . |
| 4,484,388 | 11/1984 | Iwasaki . |
| 4,507,847 | 4/1985 | Sullivan . |
| 4,513,355 | 4/1985 | Schroeder et al. . |
| 4,536,945 | 8/1985 | Gray et al. . |
| 4,551,746 | 11/1985 | Gilbert et al. . |
| 4,567,545 | 1/1986 | Mettler, Jr. .................. 361/401 |
| 4,578,697 | 3/1986 | Takemae ........................ 357/75 |
| 4,609,568 | 9/1986 | Koh . |
| 4,630,172 | 12/1986 | Stenerson et al. . |
| 4,654,694 | 3/1987 | Val . |
| 4,677,526 | 6/1987 | Muehling . |
| 4,705,917 | 11/1987 | Gates, Jr. et al. . |
| 4,764,480 | 8/1988 | Vora . |
| 4,795,722 | 1/1989 | Welch et al. . |
| 4,801,765 | 1/1989 | Moyer et al. . |
| 4,829,025 | 5/1989 | Iranmanesh . |
| 4,839,717 | 6/1989 | Phy et al. . |
| 4,866,504 | 9/1989 | Landis . |
| 4,872,260 | 10/1989 | Johnson et al. . |
| 4,879,588 | 11/1989 | Ohtsuka et al. . |
| 4,890,155 | 12/1989 | Miyagawa et al. . |
| 4,891,687 | 1/1990 | Mallik et al. . |
| 4,897,364 | 1/1990 | Nguyen . |
| 5,014,419 | 5/1991 | Cray et al. . |

FOREIGN PATENT DOCUMENTS

2352357 10/1973 Fed. Rep. of Germany .
58-119067 1/1985 Japan .

OTHER PUBLICATIONS

Brassington et al., "An Advanced Single-Level Polysilicon Submicrometer BiCMOS Technology," *IEEE Trans. Elect. Devices* (1989) pp. 712–719.
Momose et al., "1 μm n-well CMOS/Bipolar Technology," *IEDM Transactions* (Feb. 1985) p. 217.
Kapoor et al., "A High Speed High Density Single-Poly ECL Technology for Linear/Digital Applications," 1985 Custom Integrated Circuits Conference.
Gomi et al., "A Sub-30psec Si Bipolar LSI Technology," *IEDM Technical Digest* (1988) pp. 744–747.
H. Takemura, et al., "BSA Technology for Sub-100mn Deep Base Bipolar Transistors," *IEDM Technical Digest*, pp. 375–377 (1987).
Kuang Yi Chiu, et al., "A Bird's Beak Free Local Oxidation Technology Feasible to VSLI Circuits Fabrication," *IEEE Transactions on Electron Devices*, vol. ED-29, No. 4, pp. 536–540, Apr. 1982.

*Primary Examiner*—Leo P. Picard
*Assistant Examiner*—Young Whang
*Attorney, Agent, or Firm*—Townsend and Townsend

[57] ABSTRACT

Integrated circuits having electrical interconnection in a multi-chip module or package is provided. Connections involving topological cross overs are achieved in the absence of multi-layers of metalization or vias. A plurality of metal traces in a single metalization layer are provided. Wire bonding issued to connect pads from two or more chips to a common metalization trace. Because the wire bonds can be vertically spaced from substrate traces, crossover connections can be achieved without an unwanted contact between traces and pads. A similar scheme can be used to provide connection to substrate pads.

14 Claims, 4 Drawing Sheets

INTERCONNECTOR FOR A MULTI-CHIP MODULE OR PACKAGE

The present invention relates to a method and apparatus for interconnecting microelectronic components, such as integrated circuits, chip capacitors, chip resistors and oscillators, and in particular for interconnecting chips in a multi-chip module or package.

BACKGROUND OF THE INVENTION

Multi-chip modules and packages in which two or more microelectronic components are positioned on a single substrate, typically require wiring or other connection between the chips for conveying data, control signals, addresses and the like. "Microelectronic components" include integrated circuits, chip capacitors, chip resistors and crystals or oscillators. Typically, each substrate will include a plurality of locations, for forming such connections, generally referred to as pins or pads. In previous devices, interconnection was achieved between the chips using one or more layers of metalization which include a plurality of metallic lines or traces on the substrate leading, in the desired fashion, from a pad connected to one chip to a pad connected to another chip (typically by wires soldered or otherwise bonded to the pads). These previous devices were difficult to fabricate particularly in cases in which the topology of the desired connection between the chips required a crossing-over of the electrical connections. As depicted in FIG. 1, a crossing-over is required for the connection 30 between pad 118c and pad 116b and the connection 34 between pad 118a and pad 116c. The configuration shown in FIG. 1 has been simplified, for clarity, compared to the numerous pads and connections often needed in a multi-chip module or package. In the configuration as depicted in FIG. 1, first and second chips 112, 114, or dies, include a plurality of pads 116a–116n, 118a–118n. A plurality of metalization traces 22–44 are formed on or in the substrate 8 terminating in metalization connection pads 46a–46cc. The chip pads 116a–116n, 118a–118n are connected to the metalization termination pads 46 by means such as wire bonds 46a–48cc, tape bonds and the like.

In order to avoid electrical contact between the traces 30 and 34, despite the crossing-over thereof, previous devices typically required use of at least two layers of metalization 50a, 50b. In FIG. 1, the location of traces in the second layer 50b is indicated by phantom lines. Connection between the layers was provided by vertical conductive structures known as vias 52, as depicted, for example in FIG. 2. FIG. 1 depicts numerous other cross-overs achieved using traces having portions 24', 26', 36', 40', 42'44' located in the second metalization layer 50b. Trace 40, for example, has one portion in the first layer 50a to cross-over trace 38' another portion 40' in the second layer 50b to cross-over trace 42 and another portion in the first layer 50a to cross-over trace 44'.

Although this connection method is capable of providing the desired interconnection between the chips, forming vias 50 (FIG. 2) and forming more than one metalization layer 50b adds to the expense of the final product and adds to the number of process steps needed to form the product, thus increasing processing cost.

Accordingly, it would be advantageous to provide for interconnection between chips in a multi-chip module or package, allowing for crossing-over connections while avoiding the need for multiple layers of metalization or formation of vias.

SUMMARY OF THE INVENTION

According to the present invention, a system of wire bonds and traces is used to provide the electrical connection needed in case of crossing-over topology while requiring only a single layer of metalization. In general terms, the wire bond, since it can be spaced above the substrate over at least a portion of its length, can provide for the necessary topology involved in a crossing-over connection without need for a second layer of metalization.

In one embodiment, the crossing-over connection is achieved by making two or more wire-bond connections to a common metal trace formed on the substrate. In one embodiment, a substrate includes a plurality of metal traces, in the general form of a bus with wire bonds being made to the traces to accomplish the desired interconnection. The metal traces may be organized on the substrate in one or more substantially parallel groups of traces such as groups of substantially orthogonal traces. A similar approach can be used for interconnections to the lead frame fingers/bond pads, i.e., the pads on the multi-chip module or package by which the multi-chip module or package is connected to exterior devices, buses, or lead frames.

DETAILED DESCRIPTION OF THE PREFERRED EMBODIMENTS

Figure 3:
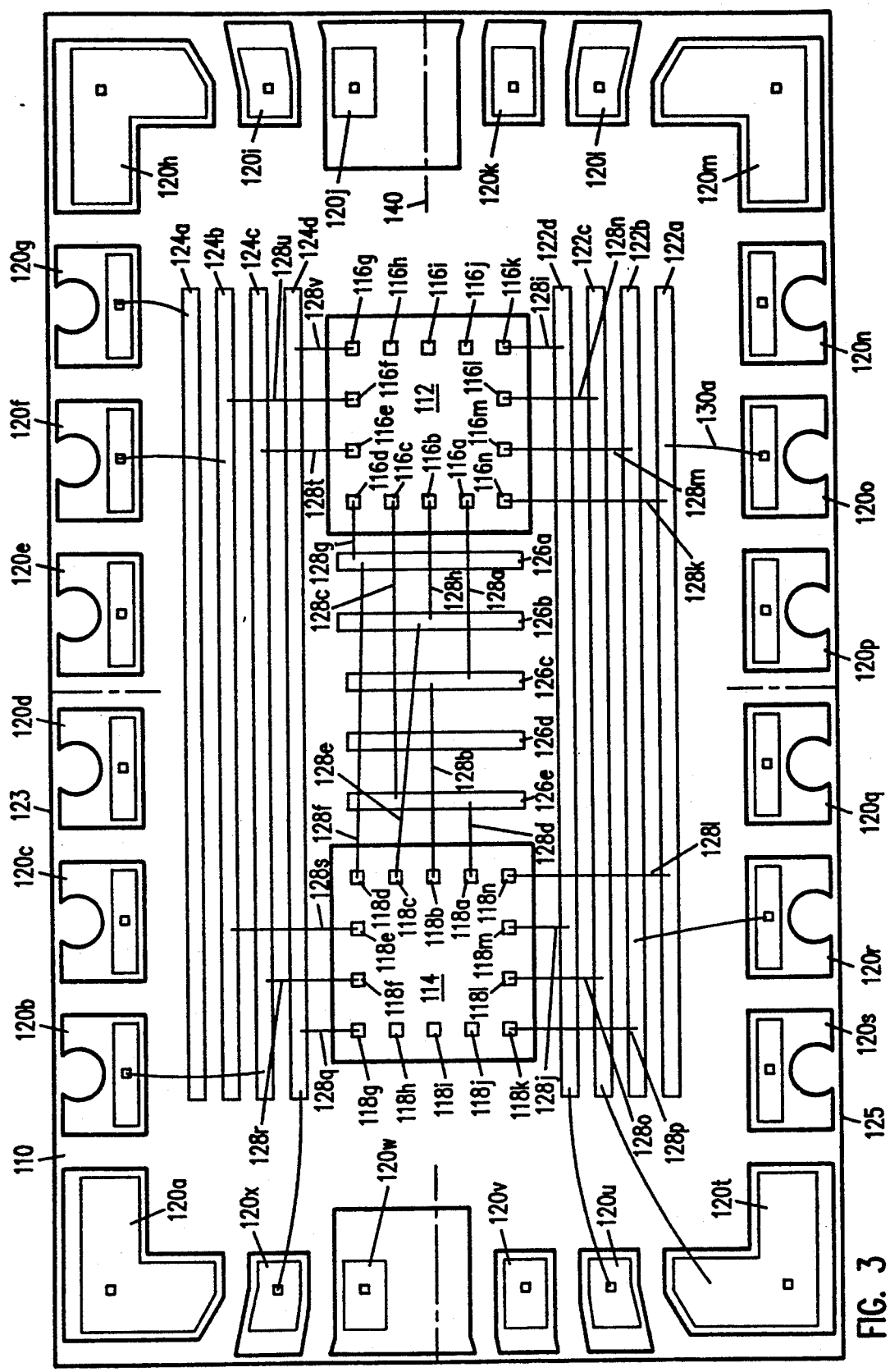
FIG. 3 is a top plan view of a multi-chip module according to an embodiment of the present invention.

As depicted in FIG. 3, a substrate 110 has attached to it first and second integrated circuit chips or dies 112, 114. Each chip 112, 114 includes a plurality of chip pads 116a–n, 118a–n.

A plurality of lead frame fingers/bond pads 120a–120x, are located on the periphery of the substrate 110. A first plurality of metal interconnect traces 122a–122d are formed on the surface of the substrate, positioned between the chips 112, 114 and a first edge 123 of the substrate. A second plurality of traces 124a–124d are positioned between the chips 112, 114 and the opposite edge 125 of the substrate 110. A third plurality of traces 126a–126d are positioned between the two chips 112, 114. If it is desired to form an interconnection between e.g., pads 116a and 118b and between pads 116c and 118a, such interconnect would be a crossover interconnect since an imaginary line connecting pad 116a with 118b would cross an imaginary line connecting pad 116c and 118a. FIG. 3 depicts how the present invention is used to achieve this crossover connection with only the single layer of metalization depicted. As shown in FIG. 3, a first wire bond 128a connects pad 116a with trace 126c. A second wire bond 128b connects pad 118b with trace 126c. A third wire bond 128c connects pad 116c with trace 126e. A fourth wire bond 128d connects pad 118a with trace 126e. In this manner, pad 116a is connected with pad 118b via wire bond 128a, trace 126c and wire bond 128b. Similarly, pad 116c is connected with pad 118a via wire bond 128c, trace 126e and wire bond 128d.

Figure 4:
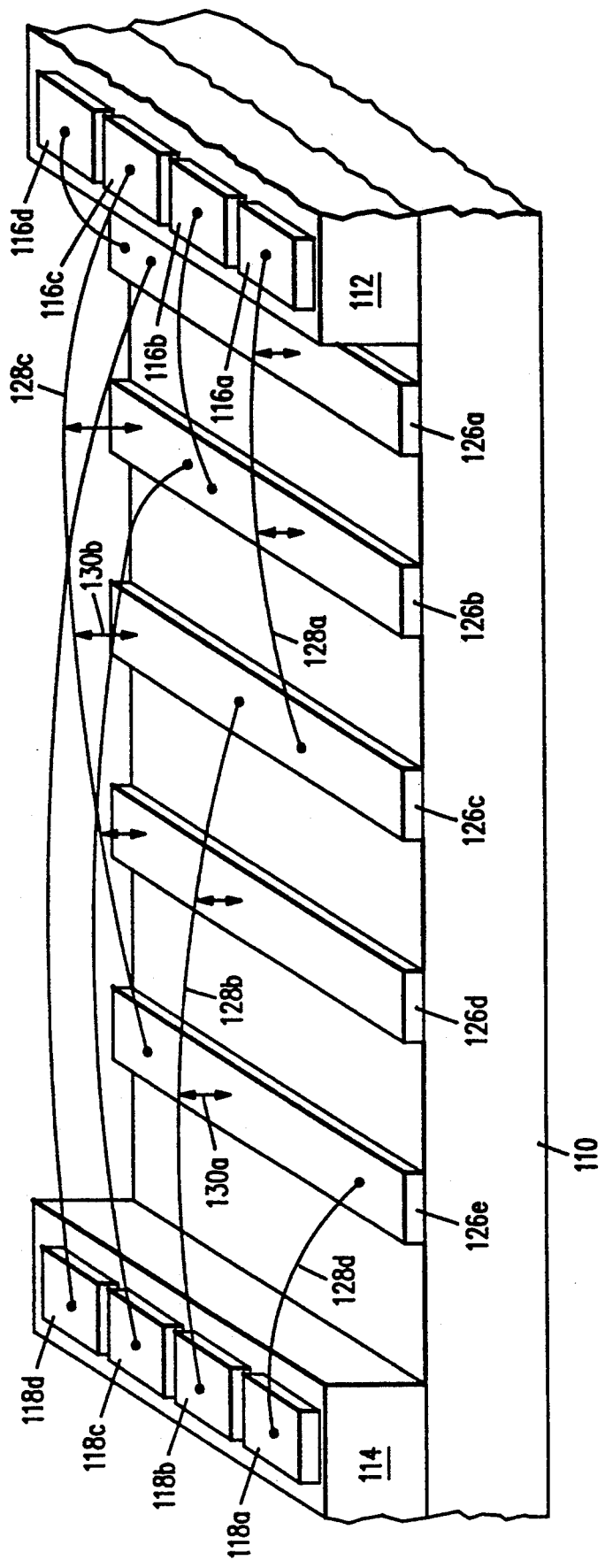
FIG. 4 is a perspective view of a portion of the multi-chip module of FIG. 3.

Crossover is achieved without unwanted connection between pads because the wire bonds 128a–128d can be spaced above the substrate, over at least a portion of their lengths, as seen in FIG. 4. As depicted in FIG. 4, the wire bonds can be vertically spaced from, although vertically aligned with, underlying traces. In the example described above, the crossover is possible because wire bond 128b is vertically spaced a distance 132a and is thus out of contact with trace 126e and wire bond 128c is vertically spaced a distance 132b from and is thus out of contact with wire trace 126c, as seen in FIG. 4.

FIG. 3 also depicts other interconnections between pads. For example, wire bonds 128i, 128j are used in conjunction with trace 122d to connect pad 116k with pad 118m.

Connections using bond wires and traces can also be used for providing electrical connection to the lead frame fingers/bond pads 120a–120x. For example, as shown in FIG. 3, wire bond 130a connects lead frame fingers/bond pads 120o to trace 122a, which is, in turn, connected to pad 116n (via wire bond 128k) and 118n (via wire bond 128l).

As depicted in FIG. 3, each of the plurality of wire bonds 128a–128v connecting the chips 112, 114 to traces 122, 124, 126 is substantially orthogonal to the longitudinal axes of the respective trace to which it connects. In the embodiment of FIG. 3, traces 126a–126e are substantially orthoganal to traces 122a–122d and 124a–124d. By providing separate sets of orthogonal traces, the desired interconnections can be achieved while avoiding excessively long wire bonds. In the embodiment depicted in FIG. 3 interconnections to the lead frame finger/bond pads 120 are made by way of traces 122, 124 parallel to the long axis 140 of the substrate and wire bonds 128i–128u perpendicular to the long axis 140. Connections that are primarily between the two chips 112, 114 can be made using traces 126a–126e perpendicular to the long axis 140 of the substrate and wire bonds 128a–128h substantially parallel to the long axis of the substrate. Wire bonds such as 128f may be slightly skewed from the long axis 140 to avoid contacting another wire bond, such as 128c.

In light of the above description, a number of advantages of the present invention can be seen. According to the present invention, it is possible to achieve a complete interconnect scheme between chips and, preferably, substrate pads on a substrate having a single layer of metalization. According to the present invention, crossover interconnections between chips on a multi-chip module or package can be achieved without the use of vias.

Figure 1:
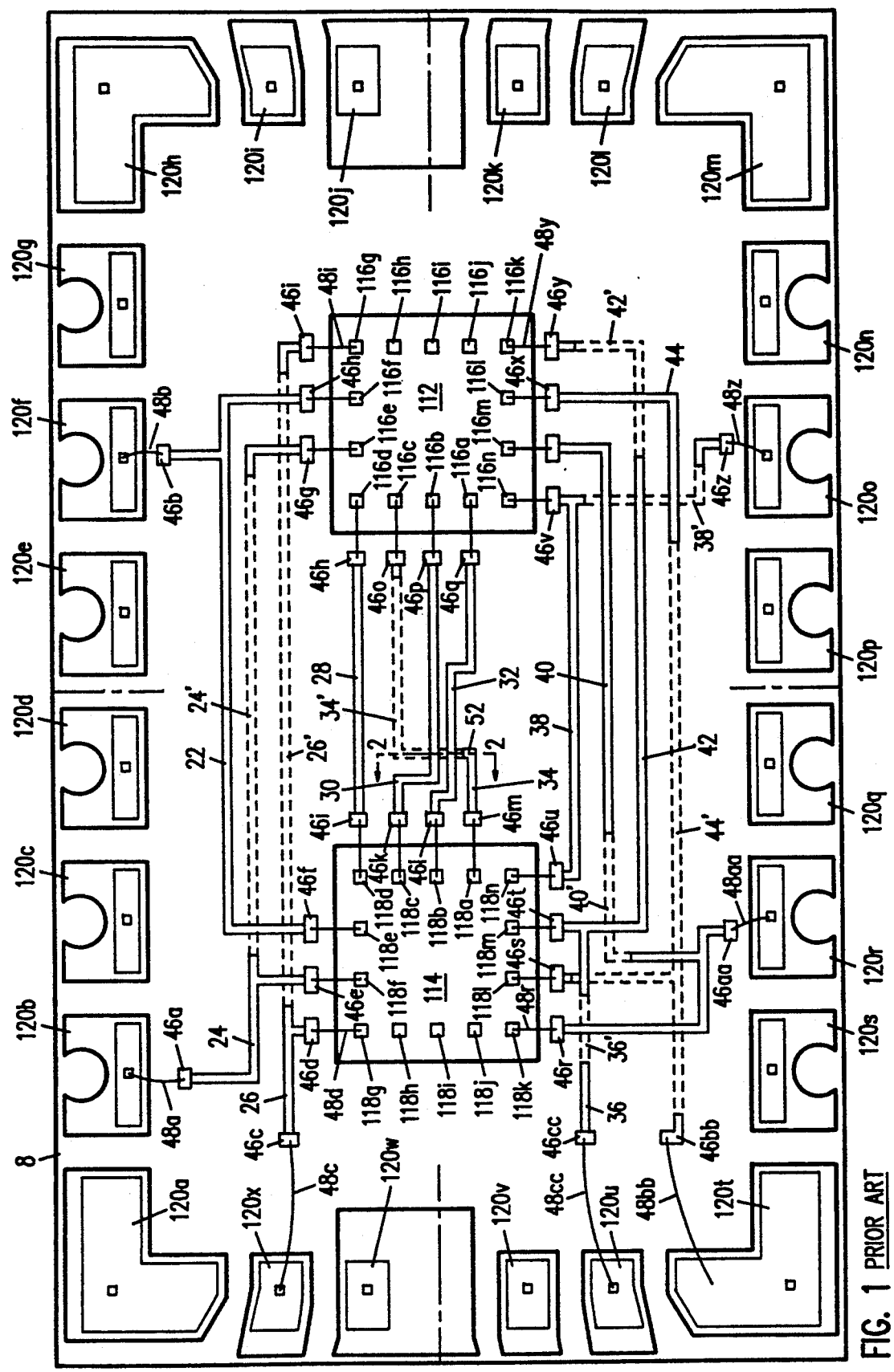
FIG. 1 is a schematic top plan view of a multi-chip module including a cross-over interconnect having vias.
Figure 2:
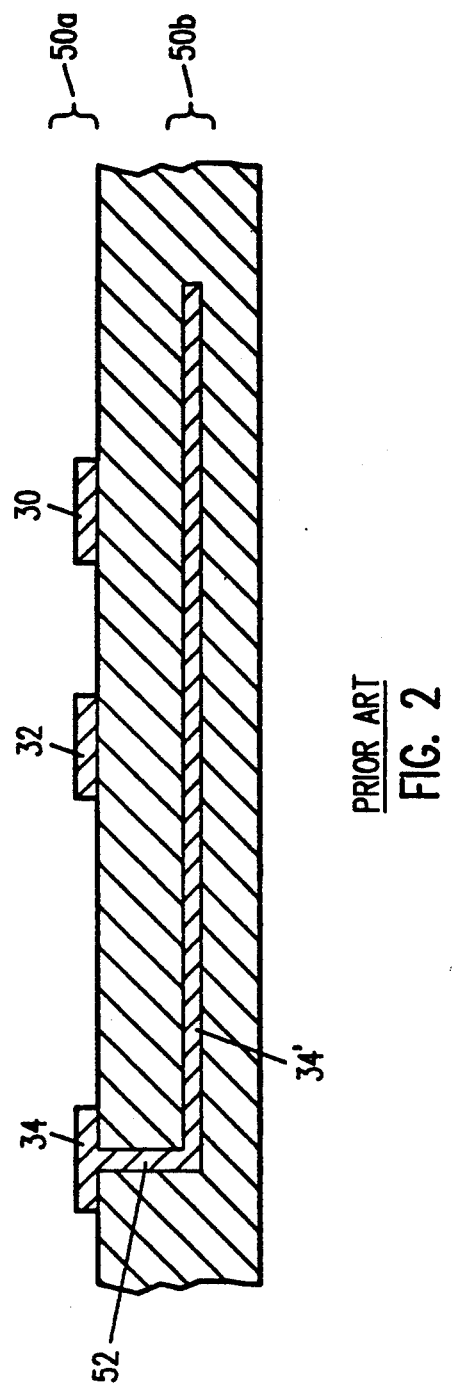
FIG. 2 is a cross-sectional view of a portion of a multi-chip module taken a long line 2—2 of FIG. 1.

The number of variations and modifications of the present invention can also be used. Although the embodiment depicted in FIG. 3 includes two integrated circuit chips, multi-chip modules and packages having three or more chips can also be used. The present invention can be used in connection with metal traces having configurations other than the linear or orthogonal configurations depicted. The interconnection apparatus and methods of the present invention can be used in combination with other types of interconnections such as those depicted in FIGS. 1 and 2. Connection between the chip pads 116, 118 and the traces 122, 124, 126 can be achieved using devices other than wire bonds such as tape bonds. It is possible to use some aspects of the invention without using other aspects. For example, it would be possible to use the wire bond/trace interconnection scheme of the present invention for connecting chips to each other without using the scheme for connecting to the substrates pads. The present invention can be used in connection with substrates having more or fewer pads and/or interconnects than those depicted. The multi-chip module, according to the present invention, can be provided in a number of packages or configurations including plastic encapsulation and ceramic or metal packages.

Although the invention has been described by way of a preferred embodiment and certain variations and modifications, other variations and modifications can also be used, the invention may be defined by the following claims.

What is claimed is:

1. Apparatus for providing electrical connections for a plurality of microelectronic components positioned on a common substrate, each microelectronic component having a plurality of connection pads, a first microelectronic component having at least first and second pads and a second microelectronic component having at least third and fourth pads, wherein an imaginary line connecting said first and third pads crosses an imaginary line connecting said second and fourth pads, the apparatus comprising:

a first means for forming a contact between said first and third pads; and a second means for forming a contact between said second and fourth pads, without forming a contact to said first pad and without forming a contact to said third pad, said second means including at least a first bonding wire spaced from said common substrate over at least a portion of the length of said first bonding wire.

2. The apparatus, as claimed in claim 1, wherein said microelectronic components include a component selected from the group consisting of an integrated circuit, a chip capacitor, a chip resistor, and an oscillator.

3. The apparatus, as claimed in claim 1, wherein said common substrate includes at least one metalization layer which includes a plurality of metal traces.

4. The apparatus, as claimed in claim 3, wherein said first bonding wire connects said second path with a first metal trace and said second means includes a second bonding wire connecting said fourth pad to said first metal trace.

5. The apparatus, as claimed in claim 1, wherein said first means includes a third bonding wire connecting said first pad to a second metal trace and a fourth bonding wire connecting said third pad to said second metal trace.

6. The apparatus, as claimed in claim 5, wherein said portion of said length of bonding wire is vertically aligned with and spaced from said second metal trace.

7. The apparatus, as claimed in claim 1, wherein said common substrate comprises a plurality of substrate bonding pads and further comprising third means for connecting at least one pad of at least one of said microelectronic components to at least one of said substrate bonding pads.

8. The apparatus, as claimed in claim 7, wherein said common substrate includes at least one metalization layer which includes a plurality of traces and wherein said third means includes a bonding wire connecting said one of said substrate bonding pads to one of said metal traces and a bonding wire connecting said metal trace to said at least one pad of at least one of said microelectronic components.

9. The apparatus, as claimed in claim 1, wherein only a single layer of metalization is used to provide said first means and said second means.

10. The apparatus, as claimed in claim 1, wherein said first means and said second means are provided without using vias in said common substrate.

11. Apparatus for providing electrical connections for a plurality of microelectronic components positioned on a common substrate, each microelectronic component having a plurality of connection pads, a first microelectronic component having at least first and second pads and a second microelectronic component having at least third and fourth pads, the apparatus comprising:

first and second metalization traces formed on said substrate and spaced from each other;
a first wire bond connecting said first pad to said first trace;
a second wire bond connecting said third pad to said first trace;
a third wire bond connecting said second pad to said second trace; and
a fourth wire bond connecting said fourth pad to said second trace.

12. The apparatus, as claimed in claim 11, wherein a portion of at least one of said third and fourth wire bonds is vertically aligned with and spaced from said first trace.

13. The apparatus, as claimed in claim 11, wherein said substrate comprises a plurality of substrate bonding pads and a third metalization trace, and further comprising a fifth wire bond connecting at least one pad of at least one of said microelectronic components to said third metalization trace and a sixth wire bond connecting said third metalization trace to at least one of said substrate bonding pads.

14. A method for electrically connecting a plurality of microelectronic component positioned on a common substrate, each microelectronic component having a plurality of connection pads, a first microelectronic component having at least first and second pads and a second microelectronic components having at least third and fourth pads, wherein an imaginary line connecting said firth and third pads crosses an imaginary line connecting said second and fourth pads, the method comprising:

forming a connection between said first and third pads; and
using a wire bond to form a connection between said second and fourth pads, without forming a connection to said first pad and without forming a connection to said third pad, while maintaining said wire bond spaced from said substrate over at least a portion of its length.

* * * * *